(12) United States Patent
Ye et al.

(10) Patent No.: US 11,575,467 B2
(45) Date of Patent: Feb. 7, 2023

(54) URLLC TRANSMISSIONS WITH POLAR CODES

(71) Applicant: IDAC Holdings, Inc., Wilmington, DE (US)

(72) Inventors: Chunxuan Ye, San Diego, CA (US); Fengjun Xi, San Diego, CA (US); Kyle Jung-Lin Pan, Saint James, NY (US)

(73) Assignee: InterDigital Patent Holdings, Inc., Wilmington, DE (US)

( * ) Notice: Subject to any disclaimer, the term of this patent is extended or adjusted under 35 U.S.C. 154(b) by 0 days.

(21) Appl. No.: 16/763,599

(22) PCT Filed: Nov. 12, 2018

(86) PCT No.: PCT/US2018/060253
§ 371 (c)(1),
(2) Date: May 13, 2020

(87) PCT Pub. No.: WO2019/099318
PCT Pub. Date: May 23, 2019

(65) Prior Publication Data
US 2020/0287659 A1    Sep. 10, 2020

Related U.S. Application Data

(60) Provisional application No. 62/630,520, filed on Feb. 14, 2018, provisional application No. 62/586,447, filed on Nov. 15, 2017.

(51) Int. Cl.
*H04L 1/00* (2006.01)
*H04L 1/1812* (2023.01)
(Continued)

(52) U.S. Cl.
CPC .......... *H04L 1/0057* (2013.01); *H04L 1/0068* (2013.01); *H04L 1/0071* (2013.01);
(Continued)

(58) Field of Classification Search
CPC ................. H04L 1/0056; H04L 1/0057; H04L 1/0058; H04L 1/0071; H04L 1/1867;
(Continued)

(56) References Cited

U.S. PATENT DOCUMENTS

| | | | | |
|---|---|---|---|---|
| 10,972,132 B2 * | 4/2021 | Jang | ...................... | H03M 13/13 |
| 2016/0013810 A1 * | 1/2016 | Gross | .................... | H03M 13/09 |
| | | | | 714/776 |

(Continued)

FOREIGN PATENT DOCUMENTS

| | | | | |
|---|---|---|---|---|
| CA | 3033537 A1 * | 2/2018 | ............ | H03M 13/13 |
| WO | 2018231026 A1 | 12/2018 | | |

OTHER PUBLICATIONS

"3GPP Chairman's Notes RAN1 Meeting #89", May 2017.
(Continued)

*Primary Examiner* — Warner Wong
(74) *Attorney, Agent, or Firm* — Condo Roccia Koptiw LLP

(57) ABSTRACT

Systems, procedures, and instrumentalities are disclosed for transmissions with polar codes. A transmitting entity may determine a mother code length. The mother code length may be based on value(s), e.g., a maximum number of transmissions. The transmitting entity may determine a number of information bits to be polar encoded. The number of information bits may be larger than a number of payload bits. The transmitting entity may map the number of information bits to a number of bit channels of a polar code. The transmitting entity may polar encode the information bits in the bit channels using the determined mother code length. The transmitting entity may partition the polar encoded bits into a number of parts. The number of parts may be based on one or more values, e.g., the maximum number of (Continued)

transmissions. The transmitting entity may transmit bits that have been interleaved to a circular buffer.

12 Claims, 14 Drawing Sheets

(51) Int. Cl.
*H04L 1/1867* (2023.01)
*H04L 69/00* (2022.01)

(52) U.S. Cl.
CPC .......... *H04L 1/1819* (2013.01); *H04L 1/1874* (2013.01); *H04L 29/00* (2013.01)

(58) Field of Classification Search
CPC ... H04L 1/1874; H04L 1/1812; H04L 1/1819; H04L 1/0067; H04L 1/0068; H04L 1/0069; H04L 1/1861; H04L 1/1863; H04L 5/04; H04L 9/0858; H04L 25/03312; H04L 25/03343; H04L 29/00; H04L 65/00; H04L 67/00
See application file for complete search history.

(56) References Cited

U.S. PATENT DOCUMENTS

| | | | |
|---|---|---|---|
| 2016/0352464 A1 | 12/2016 | Shen et al. | |
| 2017/0181104 A1 | 6/2017 | Jang et al. | |
| 2018/0034587 A1* | 2/2018 | Kim | H03M 13/2792 |
| 2018/0076929 A1* | 3/2018 | Zhang | H04L 1/0061 |
| 2018/0175976 A1 | 6/2018 | Kim et al. | |
| 2018/0323810 A1* | 11/2018 | Sarkis | H04L 1/0045 |
| 2018/0331783 A1* | 11/2018 | Ahn | H04L 1/0058 |
| 2018/0367239 A1* | 12/2018 | Jang | H04L 1/0041 |
| 2018/0367250 A1* | 12/2018 | Li | H03M 13/6588 |
| 2018/0367251 A1* | 12/2018 | Zhou | H03M 13/2906 |
| 2019/0068225 A1* | 2/2019 | Yu | H03M 13/353 |
| 2019/0115997 A1* | 4/2019 | Chen | H04L 1/0013 |
| 2019/0116002 A1* | 4/2019 | Xu | H04L 1/0041 |
| 2019/0199480 A1* | 6/2019 | Kim | H03M 13/6306 |
| 2019/0215720 A1* | 7/2019 | Li | H03M 13/09 |
| 2019/0245560 A1* | 8/2019 | Yang | H03M 13/1125 |
| 2019/0245650 A1* | 8/2019 | Hui | H04L 1/0066 |
| 2019/0296857 A1* | 9/2019 | Gritsenko | H03M 13/3769 |
| 2019/0326929 A1* | 10/2019 | Chen | H03M 13/271 |
| 2019/0334659 A1* | 10/2019 | Ye | H04L 1/0041 |
| 2019/0379486 A1* | 12/2019 | Hwang | H04L 1/0041 |
| 2019/0386778 A1* | 12/2019 | Chen | H04L 1/0068 |
| 2019/0393986 A1* | 12/2019 | Wang | H03M 13/6306 |
| 2020/0007161 A1* | 1/2020 | Dikarev | H03M 13/2789 |
| 2020/0007162 A1* | 1/2020 | Zhang | H03M 13/6588 |
| 2020/0021392 A1* | 1/2020 | Xu | H04L 1/0054 |
| 2020/0036476 A1* | 1/2020 | Yang | H03M 13/6362 |
| 2020/0067536 A1* | 2/2020 | Luo | H04L 1/0061 |
| 2020/0067537 A1* | 2/2020 | Fan | H03M 13/353 |
| 2020/0067639 A1* | 2/2020 | Lin | H04L 1/0052 |
| 2020/0083984 A1* | 3/2020 | Shen | H04L 1/0046 |
| 2020/0083987 A1* | 3/2020 | Xu | H03M 13/6356 |
| 2020/0091936 A1* | 3/2020 | Wang | H04L 1/0041 |
| 2020/0092042 A1* | 3/2020 | Huang | H04L 1/0058 |
| 2020/0119752 A1* | 4/2020 | Zhang | H04L 1/00 |
| 2020/0186284 A1* | 6/2020 | Noh | H04L 1/0067 |
| 2020/0228238 A1* | 7/2020 | Zhou | H04L 1/0043 |
| 2020/0259505 A1* | 8/2020 | Xu | H03M 13/6368 |
| 2020/0287654 A1* | 9/2020 | Xi | H04L 1/203 |
| 2020/0321986 A1* | 10/2020 | Hui | H03M 13/13 |
| 2020/0366413 A1 | 11/2020 | Ye et al. | |
| 2021/0050865 A1* | 2/2021 | Li | H04L 1/08 |
| 2021/0075538 A1* | 3/2021 | Noh | H04L 1/0033 |
| 2021/0119735 A1* | 4/2021 | Xu | H04L 1/0069 |
| 2021/0152290 A1* | 5/2021 | Li | H04L 1/1812 |
| 2021/0194505 A1* | 6/2021 | Jang | H03M 13/618 |
| 2021/0203361 A1* | 7/2021 | Noh | H04L 1/0061 |
| 2021/0234639 A1* | 7/2021 | Chen | H04L 1/0057 |
| 2021/0258829 A1* | 8/2021 | Lin | H04W 8/24 |
| 2021/0288663 A1* | 9/2021 | Wu | H03M 13/13 |
| 2021/0399742 A1* | 12/2021 | Xie | H03M 13/6516 |

OTHER PUBLICATIONS

"3GPP Chairman's notes, RAN1 NR Ad-hoc meeting", Jan. 2017.
3rd Generation Partnership Project (3GPP), R1-1608862, "Polar Code Construction for NR", Huawei, HiSilicon, 3GPP TSG RAN WG1 Meeting #86bis, Lisbon, Portugal, Oct. 10-14, 2016, 8 pages.
3rd Generation Partnership Project (3GPP), R1-1701702, "Construction Schemes for Polar Codes", Huawei, HiSilicon, 3GPP TSG RAN WG1 Meeting #88, Athens, Greece, Feb. 13-17, 2017, 7 pages.
3rd Generation Partnership Project (3GPP), R1-1702646, "Polar Code Information Bit Allocation and Nested Extension Construction", Qualcomm Incorporated, 3GPP TSG-RAN WG1 Meeting #88, Athens, Greece, Feb. 13-17, 2017, pp. 1-13.
3rd Generation Partnership Project (3GPP), R1-1702735, "Polar Code Size and Rate-Matching Design for NR Control Channels", MediaTek Inc., 3GPP TSG RAN WG1 RAN 1 #88 Meeting, Athens, Greece, Feb. 13-17, 2017, 8 pages.
Arikan, Erdal, "Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.
Li et al., "Capacity-Achieving Rateless Polar Codes", IEEE International Symposium on Information Theory (ISIT), Barcelona, 2016, pp. 46-50.
Niu et al., "CRC-Aided Decoding of Polar Codes", IEEE Communications Letters, vol. 16, No. 10, Oct. 2012, pp. 1668-1671.
Tal et al., "How to Construct Polar Codes", IEEE Transactions on Information Theory, vol. 59, No. 10, Oct. 2013, pp. 6562-6582.
Tal et al., "List Decoding of Polar Codes", arXiv:1206.0050v1, May 31, 2012, pp. 1-11.
Trifonov, Peter, "Efficient Design and Decoding of Polar Codes", IEEE Transactions on Communications, vol. 60, No. 11, Nov. 2012, pp. 3221-3227.
WO 2018/231026 A1, International Search Report dated Feb. 14, 2019, in related PCT Patent Application No. PCT/US18/60253.

* cited by examiner

URLLC TRANSMISSIONS WITH POLAR CODES

CROSS-REFERENCE

This application is the National Stage Entry under 35 U.S.C. § 371 of Patent Cooperation Treaty Application No. PCT/US2018/060253, filed Nov. 12, 2018, which claims the benefit of U.S. Provisional Application No. 62/630,520, filed Feb. 14, 2018, and U.S. Provisional Application No. 62/586,447, filed Nov. 15, 2017, all contents of which are incorporated by reference herein.

BACKGROUND

Mobile communications continue to evolve. A fifth generation of mobile communications technologies may be referred to as 5G. A previous generation of mobile communication may include, for example, fourth generation (4G) long term evolution (LTE). Mobile wireless communications may implement a variety of radio access technologies (RATs), including New Radio (NR). Use cases for NR may include, for example, extreme Mobile Broadband (eMBB), Ultra High Reliability and Low Latency Communications (URLLC), and massive Machine Type Communications (mMTC).

SUMMARY

Systems, procedures, and instrumentalities are disclosed for transmissions, e.g., ultra high reliability and low latency communications (URLLC) transmissions, with polar codes. A transmitting entity, such as a wireless transmit/receive unit (WTRU) or network entity, may determine a mother code length. The mother code length may be based on one or more values, e.g., a maximum number of transmissions, payload size, code rate, a number of bits to be initially transmitted, a WTRU category or capability, and/or data QoS. The transmitting entity may determine a number of information bits to be polar encoded. The number of information bits may be larger than a number of payload bits. The transmitting entity may map the number of information bits to a number of bit channels of a polar code. The transmitting entity may polar encode the information bits in the bit channels using the determined mother code length. The transmitting entity may partition the polar encoded bits into a number of parts. The number of parts may be based on one or more values, e.g., the maximum number of transmissions. The transmitting entity may perform interleaving on at least some of the encoded bits in each part, e.g., part-wise interleaving, global interleaving, etc. The transmitting entity may save at least a portion of remaining bits of each part to a circular buffer (e.g., the transmitting entity may filter out a top bit of each part). A bit corresponding to a high reliable bit channel may be interleaved to (e.g., saved to) a bottom of the circular buffer. The transmitting entity may transmit bits from a bottom of the circular buffer.

A receiving entity (e.g., a WTRU or network entity) may obtain modulation symbols from a data transmission, such as a transmission as described above. The receiving entity may apply an adaptive mother code length technique for polar decoding of the transmission.

BRIEF DESCRIPTION OF THE DRAWINGS

A more detailed understanding may be had from the following description, given by way of example in conjunction with the accompanying drawings wherein.

DETAILED DESCRIPTION

Figure 1:
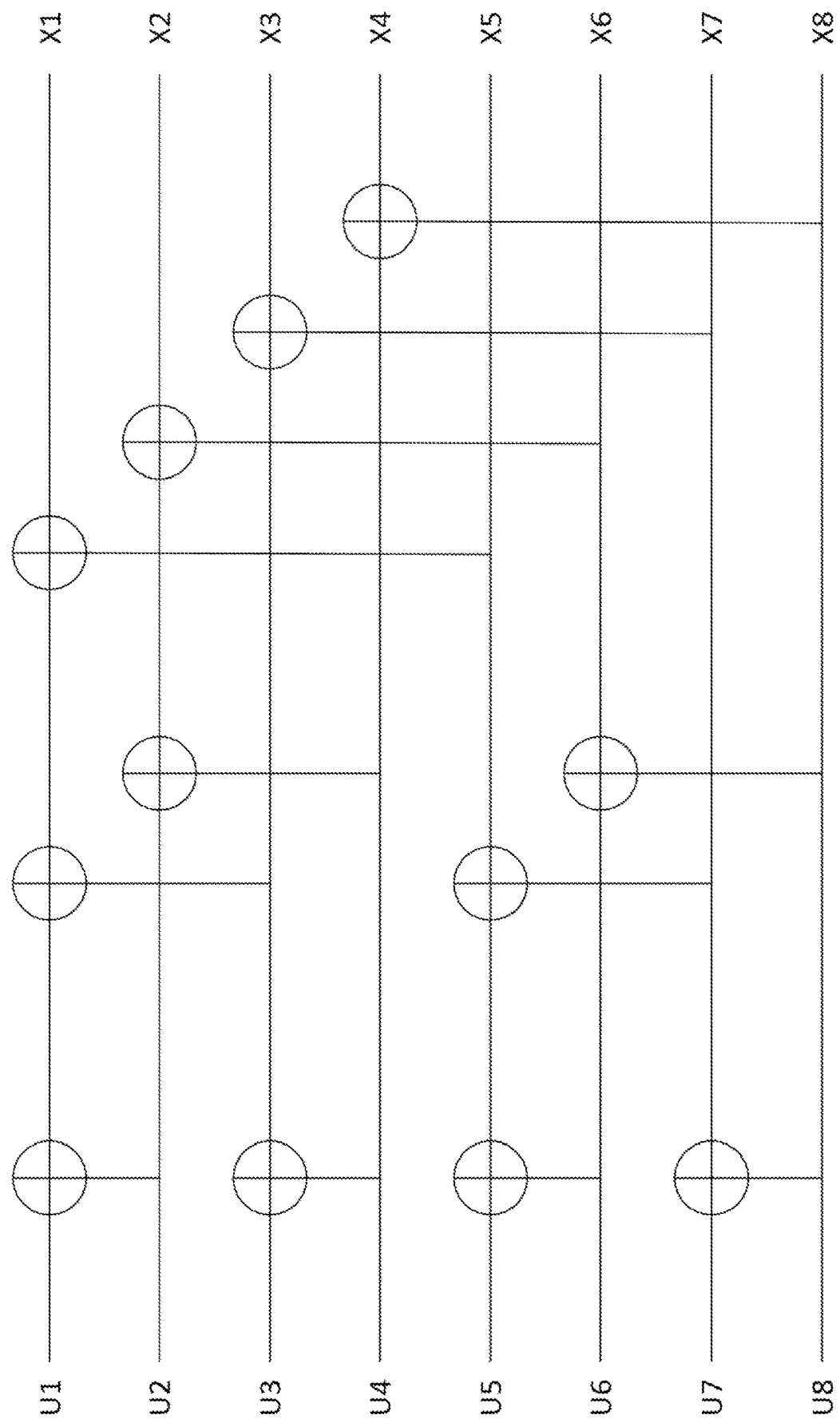
FIG. 1 shows an example polar encoder.

A detailed description of illustrative embodiments will now be described with reference to the various Figures. Although this description provides a detailed example of possible implementations, it should be noted that the details are intended to be exemplary and in no way limit the scope of the application.

A fifth generation of mobile communications technologies may be referred to as 5G. Ultra Reliable and Low latency Communications (URLLC) may be performed for 5G New Radio (NR). 5G may use one or more of the following. For example, 5G may use one or more of Enhanced Mobile Broadband (eMBB), Massive Machine Type Communications (mMTC), and/or URLLC. Requirements (e.g., different requirements) may exist for one or more of the mobile communication technologies. For example, higher data rate, higher spectrum efficiency, low power, higher energy efficiency, lower latency, and/or higher reliability may be requirements for one or more of the mobile communication technologies.

Commercial deployment of URLLC may be applied to, for example, factory automation, remote tele-surgery, real time mobile control and vehicle-to-vehicle applications, etc. In URLLC, requirements on availability and/or reliability of transmission may be emphasized, which may mean low error probability and/or low outage rate may be targets. One or more URLLC related KPIs may apply, for example, including one or more of the following. For URLLC, the target for user plane latency may be 0.5 ms for UL and/or 0.5 ms for DL. The target for reliability may be 10-5, for example, within 1 ms.

The block error rate (BLER) for data transmission may be targeted at 10%, for example, for LTE. The eNB may be in control of one or more (e.g., all) of resource allocation and/or scheduling. The transport format may be designated as a resource block and/or a Transmission Time Interval (TTI) whose length may be 1 ms in duration.

Hybrid ARQ (HARQ) for URLLC may be performed. For example, because of URLLC's requirements of high reliability and low latency, a one-shot transmission may suffer from low spectral efficiency. The inefficiency may be because (e.g., to guarantee a low error rate) a shot scheme may be conservative (e.g., may need to be conservative) in terms of bandwidth (BW) allocation, for example, so that the packet may be delivered successfully (e.g., delivered successfully, even under poor conditions, such as fading conditions). The WTRU's long-term signal-to-interference-plus-noise ratio (SINR) (e.g., geometry) may be known. If the WTRU's long-term SINR (e.g., geometry) is unknown, the transmission scheme may be conservative (e.g., may need to be conservative). In a time varying interference scenario (e.g., where an interference value may be unpredictable on top of channel fading), high reliability may not be achieved with one shot transmission and (e.g., at the same time) a number (e.g., reasonable number) of WTRUs may not be supported for the mixed traffic of URLLC and/or eMBB. HARQ schemes may not be conservative (e.g., may not be required to be conservative), for example, on initial transmission. The HARQ schemes may allocate less bandwidth on the initial transmission and/or deliver the packet (e.g., deliver the packet successfully) under one or more (e.g., most) channel conditions. The HARQ schemes may use re-transmissions to take care of the worst fading conditions.

In NR, channel coding designed for data channels of NR may support incremental redundancy (IR) and/or chase combining (CC) HARQ. The Incremental Freezing (IF) HARQ may be based on the polarization theory that part of the information bits may be re-transmitted on more reliable positions than in the previous transmissions. IR-HARQ scheme with Polar code may be desired for URLLC.

Polar coding may be performed. For example, a polar code may be adopted for control channel coding. Polar codes may be capacity achieving codes. Polar codes may be linear block codes, for example, with low encoding and/or decoding complexity, a low error floor, and/or explicit construction schemes.

A (N, K) polar code may be used. K may be the information block length. N may be the coded block length. The value N may be set as a power of 2, e.g., $N=2^n$ for some integer n. Polar codes may be linear block codes. The generator matrix of a polar code may be expressed by $G_N=B_N F^{\otimes n}$, where $B_N$ may be the bit-reversal permutation matrix, $(.)^{\otimes n}$ may denote the n-th Kronecker power, and/or $$F = \begin{bmatrix} 1 & 0 \\ 1 & 1 \end{bmatrix}.$$

In one or more polar codes, the $B_N$ may be ignored at the encoder side (e.g., for simplicity) and/or the bit-reversal operation may be performed at the decoder side. FIG. 1 shows an example of $F^{\otimes 3}$. The codeword of polar code may be given by $x_1^N = u_1^N G_N$.

A successive cancellation (SC) decoding scheme may be performed. Some decoding schemes may be developed based on SC decoding, for example, the successive cancellation list (SCL) decoding and/or Cyclic Redundancy Check (CRC)-Aided SCL decoding.

A CA (CRC-Aided) polar code may be a polar code with CRC-Aided successive cancellation list (SCL) decoder. In the CRC-aided decoding, the CRC bits may be used to select a codeword (e.g., the final codeword) from a list of candidate codewords at the end of the decoding. The CRC bits may be designed and/or used for error correction purpose (e.g., not for the traditional error detection). The CRC bits may fulfill a portion of the error detection.

Code constructions of polar codes may be performed. The polar codes may be structured, for example, in terms of encoding and/or decoding. The design of a polar code (e.g., a good polar code) may depend on the mapping of the K information bits to the N input bits of the polar encoder $u_1^N$. The K information bits may be put on the K best bit channels. The remaining N-K input bits (e.g., which may not be mapped from the information bits) may be frozen bits and/or may be set as 0. The set of the positions for frozen bits may be called frozen set $\mathcal{F}$.

The determination of bit channels (e.g., the best bit channels) may vary and/or may depend on channel conditions (e.g., real channel conditions). In determining the set of frozen channels, bit channels (e.g., all bit channels) may be ranked, for example, based on their reliabilities. The reliable bit channels may be good bit channels and/or the less reliable bit channels may be bad bit channels.

There may be one or more ways to calculate the reliability of a bit channel. For example, the Bhattacharyya bounds, the Monte-Carlo estimation, the full transition probability matrices estimation, and/or the Gaussian approximation may be used to calculate the reliabilities of bit channels. The ways (e.g., the different ways) to calculate the reliability of the bit channel may have one or more (e.g., different) computation complexities and/or may apply to one or more (e.g., different) channel conditions. In the ways to calculate the reliability of the bit channel, a parameter design signal to Noise ratio (SNR) may be selected, for example, before starting the calculation of reliabilities.

Ways may be used to calculate the rank of the bit channel, for example, that do not depend on the design SNR. For example, the rank sequence generated from a formula and/or expanded from a small sequence may be used to calculate the rank of the bit channel and/or may not depend on the design SNR.

Figure 2:
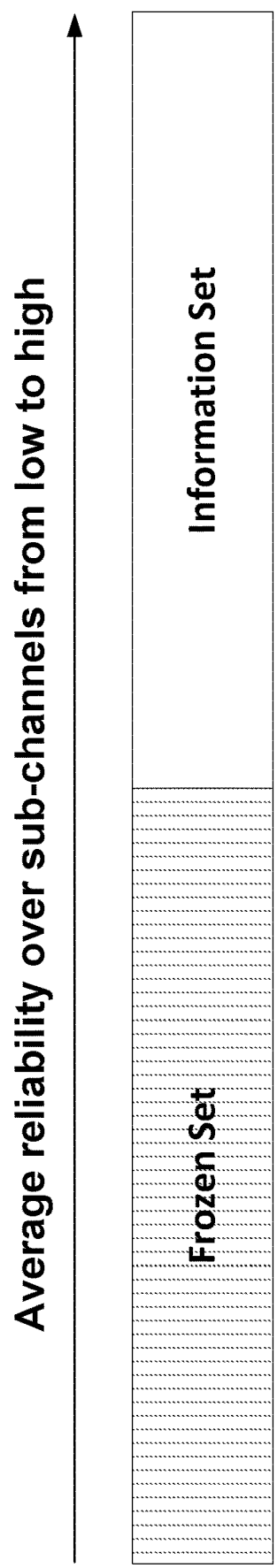
FIG. 2 shows an example polar code.

Once the rank of the bit channels is determined, the information bits may be placed at high reliable bit channels and/or the low reliable bit channels may be used for frozen bits, such as shown in the example provided on FIG. 2.

Polar encoding may be performed for URLLC Data. A polar code (e.g., polar coding) may be used for control channels (e.g., UCI and DCI), for example, for an NR eMBB. A polar code may be used for control channels (e.g., UCI and DCI) and/or a low-density parity-check (LDPC) code may be used for data channels. Low-density parity-check (LDPC) codes may include (e.g., suffer) error floor issues and/or may be incompatible (e.g., unfit) for the reliability requirement of URLLC data.

Polar encoding (e.g., a polar coding system) may be used for URLLC data. For a data channel, HARQ may be supported (e.g., may need to be supported). Polar coding (e.g., a polar coding system) may be used for a control channel and/or may not support (e.g., may not need to support) HARQ. One or more of a design for polar encoding, rate matching, or HARQ may be provided for URLLC data channel (e.g., may be needed for URLLC data channel).

Resource allocation may be used for URLLC data. URLLC data may use (e.g., require) low latency and/or high reliability. Polar encoding and/or rate matching may be performed, for example, to use low latency and/or high reliability. A resource allocation (e.g., additional resource allocation) may be used to support the transmissions of URLLC data.

URLLC polar encoding may be performed. Limited buffer rate matching may not be used for URLLC communications.

A mother code length may be determined. A polar code with a fixed mother code length (e.g., equal to N bits) may be applied. In examples, a URLLC transmission may be targeted to high reliable data (e.g., low code rate). With low code rates and/or support for HARQ, a maximum mother code length may be used for the polar encoding. The maximum mother code length N may depend on the WTRU category, capability, and/or data quality of service (QoS). The maximum mother code length for high capable WTRUs may be larger than for low capable WTRUs. For example, for data with low latency requirements, the maximum mother code length may be shorter than for data without a low latency requirement.

A polar code with variable mother code lengths may be applied. The mother code length N may depend on one or more of the following: payload size K, code rate R, a number of bits to be initially transmitted M, a maximum number of retransmissions WTRU category or capability, or data QoS. The mother code length may be configured, e.g., using Radio Resource Control (RRC) signaling.

Information bits set may be determined and/or mapped. Information bits set determination in one-stage polar encoding may be performed. Before the polar encoding, e.g., using Arikan kernel, the information bits set I and/or the frozen bits set F may be determined (e.g., first determined). The union of information bits set and/or frozen bits set may be a set of integers, for example, from 0 to N−1. The payload (e.g., with or including CRC bits) may be mapped to the information bits set I. The frozen bits set F may be (e.g., may always be) 0's.

The information bits set may be larger than the original payload (e.g., with or including CRC bits) size K. The information bits set may be larger than the original payload (e.g., with CRC) size K, for example, to support the information bits expansion (e.g., which may produce a plurality of (e.g., different) redundancy versions for IR-HARQ transmissions). The information bits set cardinality |I|>K may depend on the used polar code sequence, payload size K, code rate R, rate matchings (e.g., rate matchings used), and/or the maximum number of retransmissions $RV_{max}$. Deriving information bits set and/or mapping the information bits to the information bits set may include one or more of the following. If the maximum mother code length is N and maximum number of retransmissions is 2 or 4, the reliability ranking of N bits is given by $Q_0 < Q_1 < \ldots < Q_{N-1}$. $Q_i$ may be the bit channel index corresponding to the i-th least reliable bit channel. The information bits set cardinality |I| may be determined by (N−j), for example, where j may be the index such that $$\sum_{i=j}^{N-1} 1\bigg|_{Q_i \geq \frac{RV_{max}-1}{RV_{max}} \cdot N} = K.$$

The set $\{Q_j, Q_{j+1}, \ldots, Q_{N-1}\}$ may include K bit channels, for example, with indices larger than, or equal to, $$\frac{RV_{max}-1}{RV_{max}} \cdot N.$$

One or more approaches may be used to determine an information bits set. The information bits set may be of the same cardinality as the payload size. The information bits set may be of a different (e.g., larger) cardinality than the payload size.

Information bits set may have the same length as the payload. Depending on the rate matching schemes, frozen bits (e.g., some frozen bits) may be predetermined. Using the reliability order from a polar code sequence, the K most reliable bit channels (e.g., which may not be pre-frozen) may be set as the information bits set, and/or the K payload bits may be mapped (e.g., mapped one-by-one) to the information bits set.

The information bits set I may be of a larger size than the payload K. For example, if the information bits set I is of larger size than the payload K, the mapping from K payload bits to the information bits set may be a one-to-many mapping. One or more of the following may apply for the case where the information bits set is larger than the payload. The N bit channels of polar code may be divided (e.g., sequentially equally divided) by y parts, where y may be a power of 2 and/or may depend on the maximum number of re-transmissions K payload bits (e.g., all the K payload bits) may be mapped to the last part (e.g., N/y) of the bit channels. The last part of the bit channels may be the last block of (N/y) bit channels (e.g., bit channels (y−1)/y*N, (y—1)/y*N+1, . . . , N−1). One or more (e.g., a portion) of the K payload bits may be mapped to the other (y−1) parts. One or more (e.g., each) parts of the bit channels may correspond to a redundancy version (e.g., a predefined redundancy version), e.g., each respective part may correspond to a respective redundancy version.

The mapping of the K payload bits to the last part of the bit channels may be similar to legacy mapping. The mapping may depend on the selected rate matching scheme. Bit channels (e.g., some bit channels) may be pre-freezed, for example, due to the punctured bits at the outputs.

The second to last part may refer to the second to last block of N/y bit channels (e.g., bit channels (y−2)/y*N, (y−2)/y*N+1, (y−1)/y*N−1). The information bits set in the second to last part mapping may be selected from the set of bit channels $\{Q_j, Q_{j+1}, \ldots, Q_{N-1}\}$, for example, whose indices may be between $$\frac{RV_{max}-2}{RV_{max}} \cdot N \text{ and } \frac{RV_{max}-1}{RV_{max}} \cdot N.$$

There may be L bit channels and/or the bit channel set may be denoted by $\mathcal{S}$. Mapping L payload bits to the bit channels may be performed in one or more of the following ways.

The L information bits may be selected from the K total information bits, for example, which may be mapped to the least reliable bit channels in the last part of the polar encoder. The L selected information bits may be mapped to the bit channel set $\mathcal{S}$, for example, according to the bit channels' (e.g., reverse) reliability order. In examples, if an information bit is mapped to the least reliable bit channel (e.g., in the last part of the polar encoder), the information bit may be mapped to the most reliable bit channel in $\mathcal{S}$. In examples, if an information bit is mapped to the least reliable bit channel (e.g., in the last part of the polar encoder), the information bit may be mapped to the least reliable bit channel in $S$.

The L information bits may be selected from the K total information bits, for example, which may be mapped to the smallest indices bit channels in the last part of the polar encoder. The L selected information bits may be mapped to the bit channel set $S$, for example, in an order (e.g., a natural index order). For example, if an information bit is mapped to the first bit channel (e.g., in the last part of the polar encoder), the information bit may be mapped to the first bit channel in $S$. The early termination capability of the distributed CRC scheme may be maintained. If an information bit is mapped to the first bit channel in the last part of the polar encoder, the information bit may be mapped to the last bit channel in $S$.

The third to last part mapping may be performed. The information bits set may be selected from the set of bit channels $\{Q_{l+1}, \ldots, Q_{N-1}\}$, for example, whose indices may be between $$\frac{RV_{max} - 3}{RV_{max}} \cdot N \text{ and } \frac{RV_{max} - 2}{RV_{max}} \cdot N.$$

There may be L' bit channels and/or the bit channel set may be denoted by $S$. L' payload bits may be mapped to the bit channels in one or more of the following ways.
The L information bits may be selected from K information bits, for example, which may be mapped to unreliable (e.g., the least reliable) bit channels in the second to last part of the polar encoder. The L selected information bits may be mapped to the bit channel set $S$, for example, based on the reliability order of the bit channels the L information bits are mapped to in the second to last part mapping. (e.g., their reverse reliability order). For example, an information bit may be mapped to the most reliable information bit channel in the second to last part. If the information bit is mapped to the most reliable information bit channel in the second to last part, the same information bit may be mapped to the least reliable bit channel in S for the third to last part mapping. An information bit may be mapped to the least reliable information bit channels in the second to last part. If the information bit is mapped to the least reliable information bit channels in the second to last part, the same information bit may be mapped to the most reliable bit channel in S for the third to last part mapping.

The L information bits may be selected from K information bits, for example, which may be mapped to the smallest indices bit channels in the second to last part of the polar encoder. The L selected information bits may be mapped to the bit channel set $S$, for example, in a natural index order.

Mapping of one or more of the other parts may follow the mapping provided herein. For example, mapping of one or more of the other parts may follow the example illustrated for the mapping for the third to last part.

Information bits set determination in two-stage polar encoding may be performed. In the above, a single mother code length-N polar encoding may be applied. A two-stage polar encoding may be used. In the first stage (e.g., based on K and R), one or more (e.g., several) small polar codes may be used in parallel. For example, y polar encoders may be used, where each polar encoder may use a length N/y. y may be a power of 2. The size of y may depend on K and R. For the last polar encoder, the mapping of K payload bits to the N/y bit channels may be performed (e.g., performed by considering the rate matching and the pre-frozen bits). For the first (y-1) polar encoders, the mapping of payload bits to the N/y bit channels may be different from the last polar encoder. Part (e.g., only part) of the payload bits may be mapped to the (y-1) polar encoders.

The output of they polar encoders may be processed (e.g., further processed) in the second stage. An Arikan kernel may be applied, for example, as a block-wise operation, where a (e.g., each) of the y polar encoders may be treated as a block. For example, y=4 and $a_i$, i=1, . . . , 4 may be the coded bits of the i-th polar encoder of length N/4. The outputs of the second stage processing may be $[a_1 \otimes a_2 \otimes a_3 \otimes a_4, a_2 \otimes a_4, a_3 \otimes a_4, a_4]$.

Circular buffer and rate matching may be performed (e.g., associated with URLLC). One or more of the following may apply. Saving polar encoded bits to a circular buffer may be performed. Bit selection for rate matching may be performed. Saving partial polar encoded bits to a circular buffer may be performed. Circular buffer design to support up to two retransmissions may be provided. Configuration and control signaling for URLLC HARQ may be performed.

Polar encoded bits may be saved in a circular buffer. Before saving, for example, the coded bits may be reordered. The bit reordering may support multiple rate matching schemes and/or IR-HARQ operations. There may be one or more (e.g., three) categories of rate matchings, including one or more of the following: shortening, puncturing, and/or repetition. Shortening may achieve the best BLER performance, for example, at high code rates (e.g., >7/16). The puncturing rate matching may achieve the best BLER performance, for example, at low code rates. Repetition may achieve good BLER performance, for example, at low code rates. The number of bits (e.g., the total number of bits) for transmission may be larger than a power of two. For example, the number of bits for transmission may be 130, which is larger than 128 ($2^7$).

The performance range (e.g., a good performance range) of shortening may not lie in the URLLC supported coding range. Shortening may not be used in the rate matching.

The coded bits may be interleaved, for example, before the coded bits are saved to circular buffer. The coded bits may be interleaved, e.g., so that a puncturing may be supported by operations of the circular buffer.

If a split natural puncturing is supported, the coded bits may be separated (e.g., sequentially separated equally) to 4 sub-blocks. The middle two sub-blocks may be bit-wised interlaced, for example, before saving them to a circular buffer. If sub-block based puncturing is supported, the coded bits may be sequentially separated equally to p sub-blocks, say, $b_0, b_1, \ldots, b_{p-1}$. The sub-blocks may be interleaved by a pattern. The bits within a sub-block may be interleaved or may not be interleaved.

Figure 3:
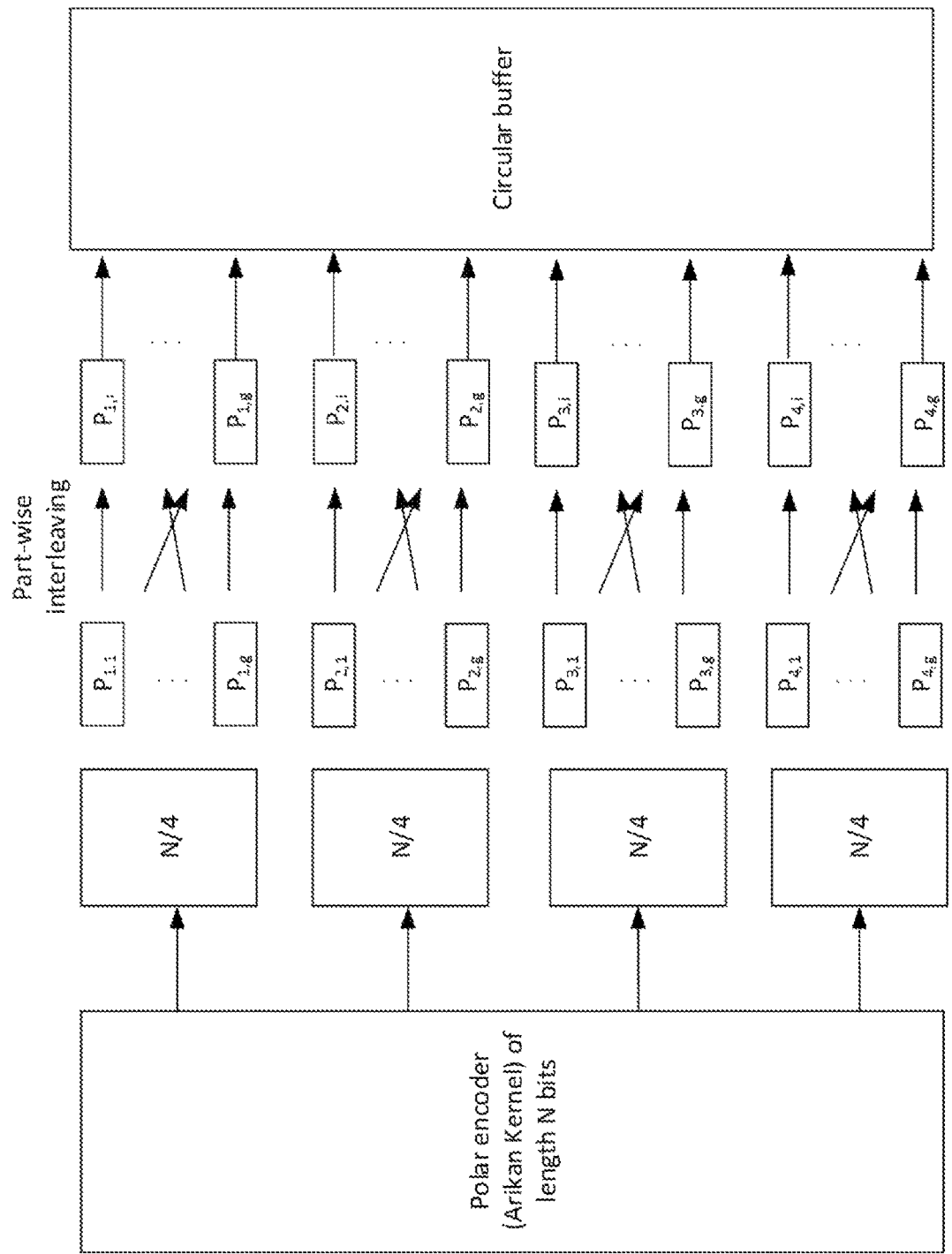
FIG. 3 shows an example part-wise interleaving.

Part-wise interleaving may be performed. For example, in polar encoding, a (e.g., each) polar encoder may be of mother code length N/y bits. y may depend on a maximum number of retransmissions. The N coded bits may be separated (e.g., sequentially separated) toy parts. The coded bits interleaving operations may be applied on a (e.g., each) part (e.g., of N/y coded bits). FIG. 3 shows an example of the part-wise interleaving operations, where y may be equal to 4. One or more (e.g., each) parts in FIG. 3 may correspond to a redundancy version (RV). Coded bits (e.g., each of the N/4 coded bits) may be interleaved, for example, independent of other coded bits. Within a (e.g., each) part, sub-block wise interleaving and/or middle interlacing of interleaving may be applied. The design of the interleaving pattern may take into account that shortening may not be applied for URLLC data. The bottom coded bits (e.g., within each part) may be transmitted (e.g., may always be transmitted). The bottom coded bits may not be interleaved (e.g., may not need to be interleaved). For example, the sub-block interleaving may be applicable (e.g., may only be applicable) to the front coded bits. The interleaved bits of a (e.g., each) part may be saved to circular buffer sequentially.

Figure 4:
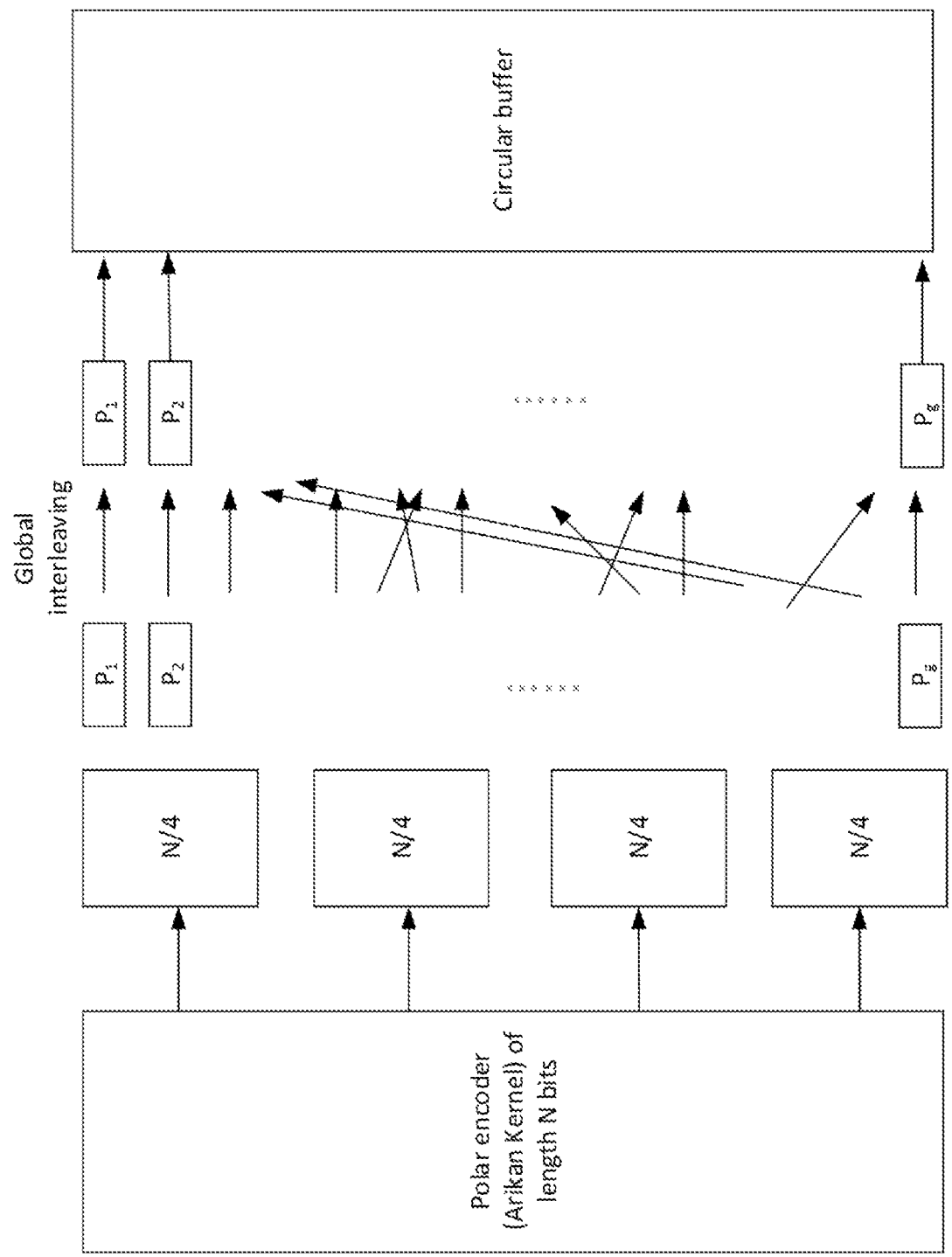
FIG. 4 shows an example global wise interleaving.

Global-wise interleaving may be performed. The interleaving may be applied across the coded bits (e.g., all the N coded bits) (e.g., may be applied across all the parts). FIG. 4 shows an example of the global-wise interleaving operations, where the coded bits (e.g., all the N coded bits) may be interleaved globally. The sub-block wise interleaving may be applied. The design of the interleaving pattern may follow a reliability rule. For example, the encoded bits corresponding to low reliable bit channels (e.g., within each of the small polar encoder) may be interleaved to the front of circular buffer, for example, while the encoded bits corresponding to high reliable bit channels may be interleaved to the bottom of circular buffer.

Figure 5:
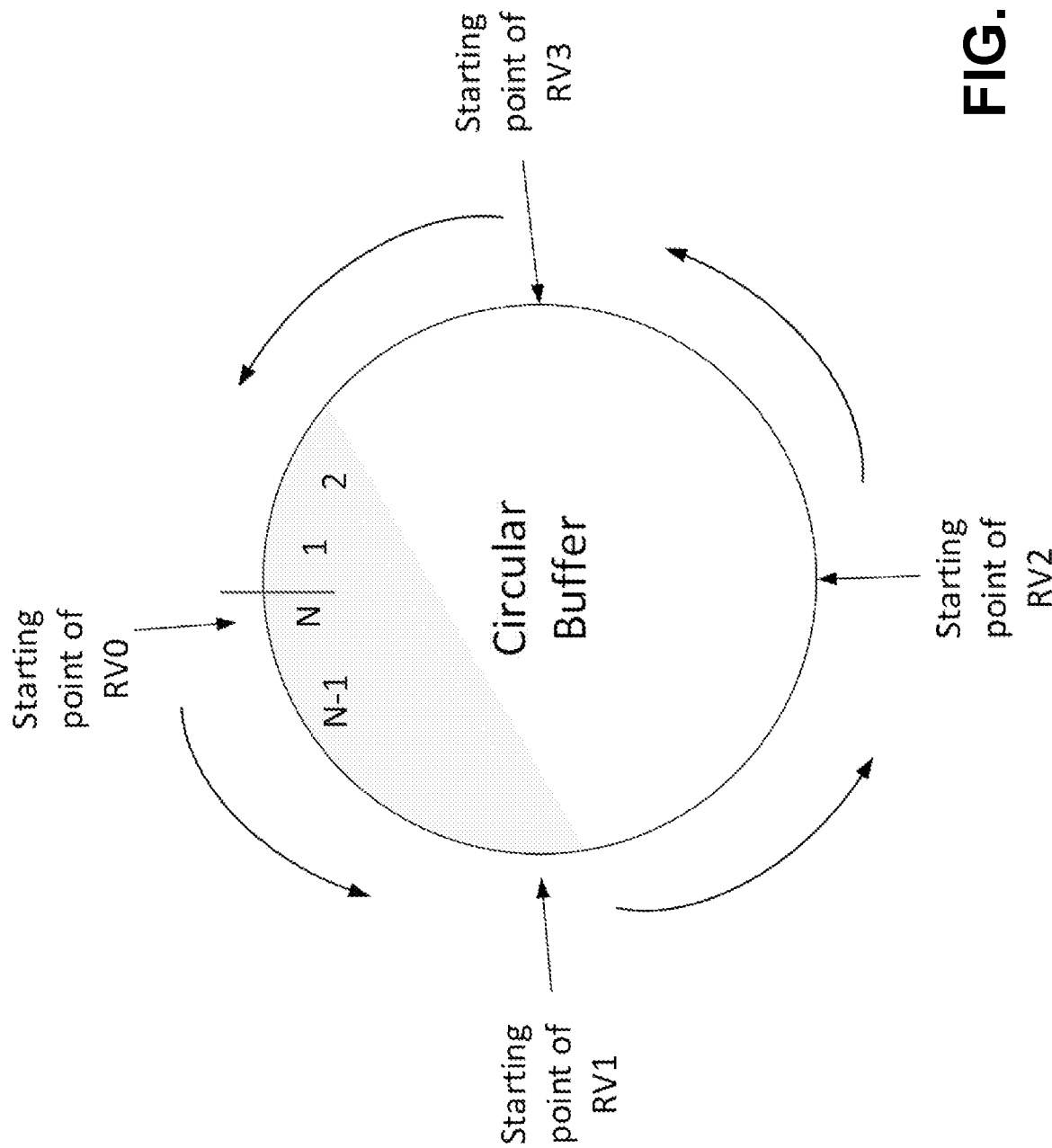
FIG. 5 shows an example bit selection from a circular buffer.
Figure 5B:
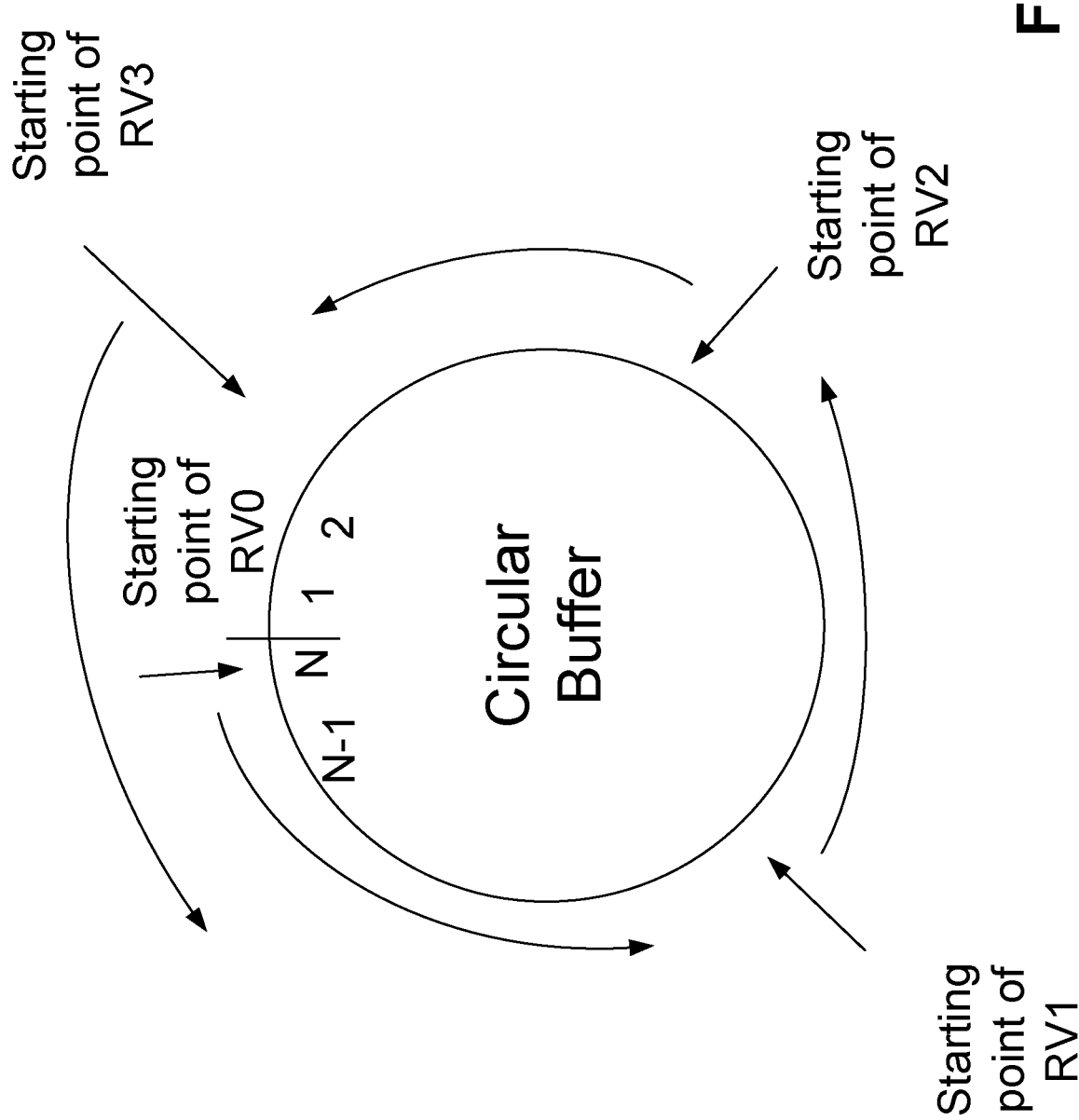
FIG. 5B shows an example bit selection from a circular buffer, e.g., with more than 1 self-decodable redundancy version (RV).

Bit selection for rate matching may be performed. FIG. 5 shows an example bit selection from a circular buffer. FIG. 5B shows an example bit selection from a circular buffer with more than 1 self-decodable RV.

The interleaved bits may be saved to a circular buffer. The circular buffer reading may be in reverse order. For example, the reading from the circular buffer may be from the bottom of the circular buffer for the initial transmission RV0. The starting point of a (e.g., each) redundancy version may be uniformly distributed over N coded bits. For example, as shown in FIG. 5, the starting point for RV1 may be at $$\frac{3N}{4},$$

the starting point for RV2 may be at $$\frac{N}{2},$$

and/or the starting point for RV3 may be at $$\frac{N}{4}.$$

To support HARQ (e.g., adaptive HARQ), the starting point of an (e.g., each) RV may be adjusted. The starting point of an RV (e.g., other than RV0) may be set such that the RV is self-decodable. For example, as shown as RV3 in FIG. 5B, the starting point of the RV may cover the last quarter of the N coded bits.

A circular buffer and rate matching scheme (e.g., with alternate or complimentary features) may be provided. Partial polar encoded bits may be saved to a circular buffer. In circular buffer and rate matching operations described herein, the N encoded bits (e.g., all the N encoded bits) may be saved to the circular buffer. Less than N encoded bits may be saved to the circular buffer. Saving less than N encoded bits to the circular buffer may be used when (e.g., only when) puncturing is used and/or when the repetition is not used. The number of bits to be saved to the circular buffer may be as low as M bits, for example, which may be a number of bits to be transmitted in the initial transmissions. This may apply to the CC-HARQ case. For IR-HARQ cases, the number of bits to be saved to the circular buffer may be as high as $M \cdot RV_{max}$.

Figure 6:
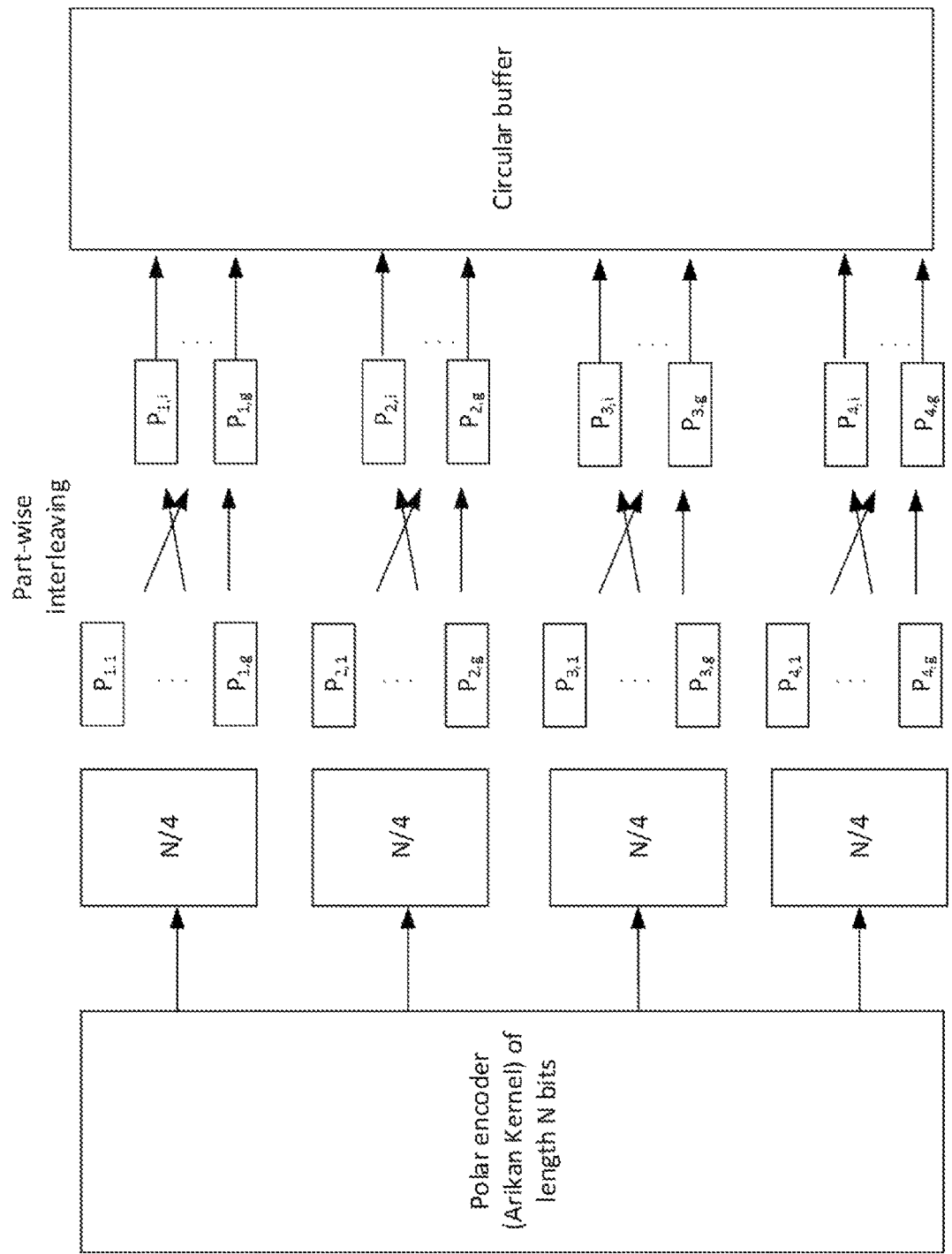
FIG. 6 shows an example part-wise interleaving with partial coded bits saved in buffer.

FIG. 6 shows example circular buffer operations, for example, where part (e.g., only part) of the coded bits may be saved to the buffer. To support the puncturing scheme, for example, the latter portion (e.g., only the latter portion) of the encoded bits may be saved (e.g., saved to a circular buffer).

A portion (e.g., the same portion) of the bits in a (e.g., each) part may be saved to a circular buffer. This may work for a non-adaptive HARQ. For example, there may be g sub-blocks in part i, denoted by $P_{i,1}, \ldots, P_{i,g}$. After sub-block wise interleaving, a subset D of $\{1, \ldots, g\}$ (e.g., only a subset D of $\{1, \ldots, g\}$) of the sub-blocks may be saved to the circular buffer, for example, $\{P_{i,j}, I \in D\}$. The subset may be applied to one or more (e.g., all) of the parts.

A portion (e.g., a different portion) of the bits in a (e.g., each) part may be saved to a circular buffer. This may work for adaptive HARQ. For example, one or more (e.g., each) part i may have its own subset Di of $\{1, \ldots, g\}$ of the sub-blocks to be saved to the circular buffer, for example, $\{P_{i,j}, I \in Di\}$.

The cardinality of the subset D and/or Di may depend on the rate matching output size of one or more (e.g., each) transmissions.

Figure 7:
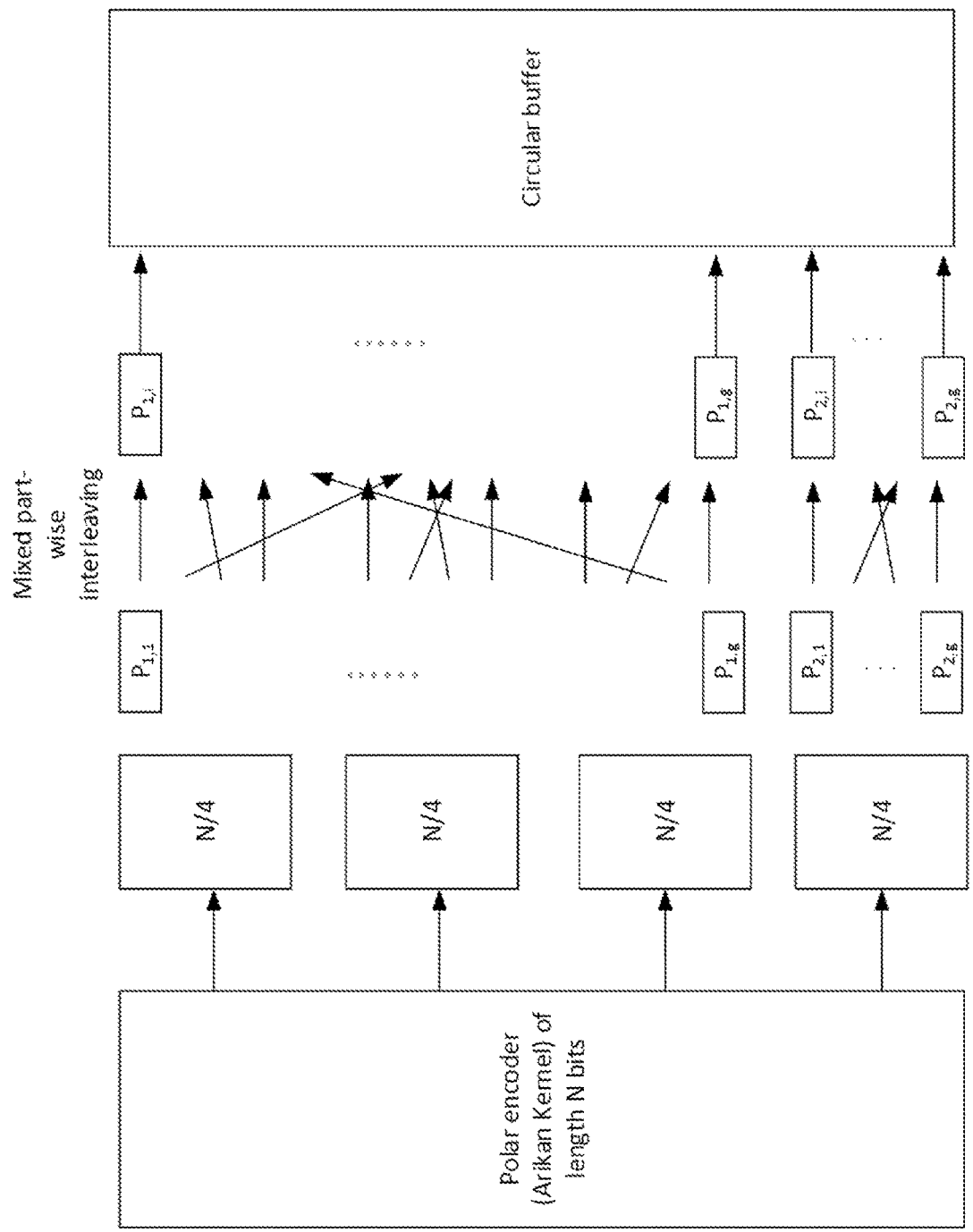
FIG. 7 shows an example mixed part-wise interleaving to support transmissions.

A circular buffer design may support one or more (e.g., two) retransmissions. The maximum number of retransmissions may be less than 4, e.g., due to the low latency requirements for URLLC transmissions. For example, a maximum of 2 transmissions may be supported for URLLC data. The adaptive HARQ may be used. For example, the retransmission may have more coded bits than the initial transmission. An example of the supportive circular buffer may be as in FIG. 7. The last quarter of the coded bits may be interleaved, and/or the first three quarter of the coded bits may be interleaved (e.g., interleaved independently). This scheme may be used with the example scheme shown in FIG. 6.

Figure 8:
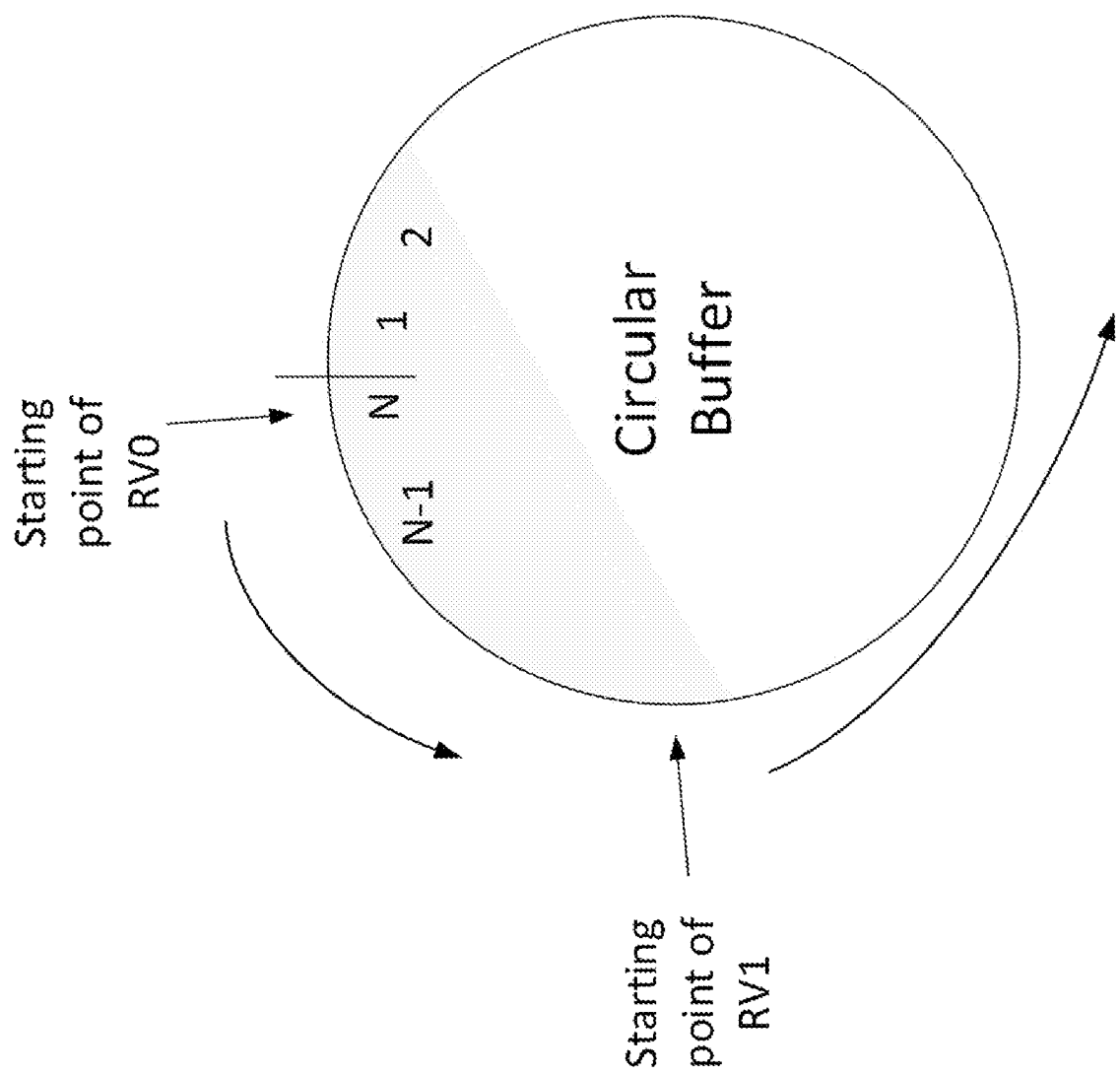
FIG. 8 shows an example bit selection from a circular buffer for two transmissions.

The bit selection from the circular buffer may have (e.g., may only have) two starting positions, as shown in the example provided on FIG. 8.

One or more circular buffers may be used to support IR-HARQ transmissions.

Configuration and control signaling for URLLC HARQ may be performed. For URLLC data transmissions, CC-HARQ and/or IR-HARQ may be supported. In examples, CC-HARQ (e.g., only CC-HARQ) may be supported for URLLC data transmissions. A WTRU may support (e.g., may only support) CC-HARQ due to WTRU capability and/or category. A WTRU capability and/or category may be configured (e.g., statically configured) by an RRC signaling message. Table 1 may be defined for HARQ support (e.g., different HARQ support), for example, for WTRU categories (e.g., different WTRU categories). A WTRU may require IR-HARQ support. For example, if a WTRU supports (e.g., is required to support) high data rates, the WTRU may have (e.g., may need to have) IR-HARQ support. A WTRU may apply (e.g., may only apply) CC-HARQ. For example, a WTRU may apply (e.g., may only apply) CC-HARQ if a WTRU does not support (e.g., is not required to support) high data rates.

TABLE 1

Example HARQ support determination depending on WTRU category

| UE category | Data rates | HARQ support |
| --- | --- | --- |
| X1 | High | Both IR-HARQ and CC-HARQ |
| X2 | Medium | Both IR-HARQ and CC-HARQ |
| X3 | Low | CC-HARQ |

A WTRU may (e.g. may only) support CC-HARQ, for example, for one or more predefined data types and/or QoS. Supporting CC-HARQ (e.g., only supporting CC-HARQ) may be achieved by a high layer semi-static configuration. For example, RRCConnectionReconfiguration or RRCConnectionEstablishment may include information on operational HARQ types.

As an example, the following may be added to the RRCConectionReconfiguration message.

```
RRCConnection Reconfiguration ::= SEQUENCE {
    URLLC HARQ         ENUMERATED {CC, CC-IR}
    ... ...
}
```

Dynamic configuration of HARQ types may be supported. For example, the DCI and/or UCI may include a flag indicating whether an IR-HARQ scheme is supported, e.g., in the transmission of the TB. The field of RV order may be saved in the DCI or UCI, for example, because the field of RV may not be needed if CC-HARQ (e.g., only CC-HARQ) is supported.

A DCI format may include one or more of the following fields, for example, to support URLLC HARQ. The DCI format may include an IR-HARQ support flag (e.g., a 1 bit flag); a redundancy version (e.g., 2 bits), for example, used if the IR-HARQ support flag is set on; a new data indicator (e.g., 1 bit); a modulation and coding scheme (e.g., 5 bits or 4 bits if high order modulation is not supported and less items in MCS table for URLLC (e.g., less items in MCS table for URLLC than in MCS table for eMBB)); a HARQ process number (e.g., 4 bits); an identifier for DCI formats (e.g., 1 bit); and/or a frequency and time domain resource assignment.

Fields (e.g., different fields) in a DCI format (e.g., existing DCI format) may be re-interpreted, for example, because a field (e.g., a new field, such as IR-HARQ support flag) may be introduced and/or a field length may be reduced. For example, a modulation and coding scheme field may be reduced from 5 bits to 4 bits (e.g., considering a high order modulation may not be supported and/or less items or entries may be included in the MCS table for URLLC). The redundancy version may be valid if (e.g., only if) the IR-HARQ support flag is ON. The CC-HARQ may be supported (e.g., may always be supported), for example, if the IR-HARQ support flag is ON or OFF. The redundancy version may be (e.g., may always be) equal to 0, for example, if CC-HARQ (e.g., only CC-HARQ) is supported.

Adaptive mother code length determination for polar decoding may be performed. Polar encoding, rate matching, and/or HARQ for URLLC data transmissions may be performed, for example, as described herein. A receiver may obtain the modulation symbols for the URLLC data transmissions. The receiver may obtain the log-likelihood ratio (LLR) of bits from the current transmission, for example, by demodulation.

The transmitter may apply a mother code length (e.g., a maximum mother code length) for polar encoding, for example, as described herein. The polar decoding may not use (e.g., may not have to use) the same mother code length as the polar encoding, for example, based on the polar code properties that the latter part of the encoded bits may not be affected by the upper part of the information bits.

The decoder may use a mother code length that is different (e.g., shorter) than the mother code length used by the transmitter. For example, the transmitter may generate as many encoded bits as possible. The encoded bits (e.g., all of the encoded bits) may not be sent to the receiver. The receiver may select a proper mother code length for decoding, for example, based on how many bits are received.

An adaptive mother code length may be applied for polar decoding. The determination of the mother code length may depend on the status of the circular buffer. A one-stage polar encoding scheme may be used, for example, as described herein. The receiver may check the circular buffer status, for example, after receiving demodulated symbols and/or storing LLRs (e.g., the corresponding LLRs) into the circular buffer. The maximum mother code length may be N bits. The latter part of the circular buffer at the receiver may be filled in (e.g., may be filled in first), for example, as described herein. L may be the smallest index of the filled LLR in the circular buffer. The mother code length for polar decoding may be calculated based on L. For example, if $$2^{-l-1} \leq \frac{N-L}{N} < 2^{-l}, \text{ for } l = 1, 2, \ldots, \log_2 N \quad (*)$$

$$\text{Or } 2^{-l-1} \leq \frac{N-L}{N} \leq 2^{-l}, \text{ for } l = 0$$

then the mother code length for polar decoding may be selected as $N \cdot 2^{-l}$.

For example, N=512. If L=270, the mother code length for polar decoding may be selected as $N \cdot 2^{-1} = 256$.

Figure 8B:
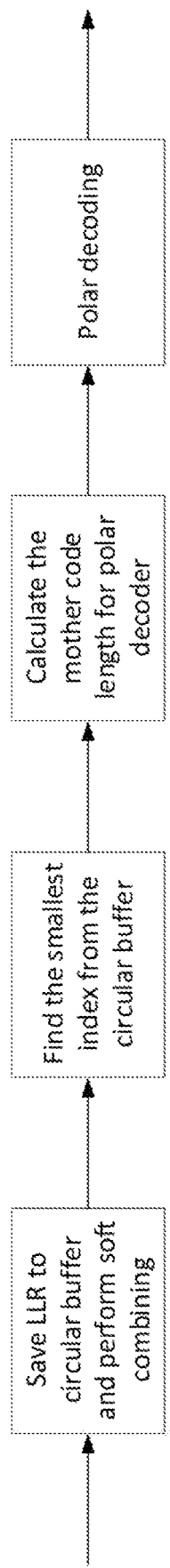
FIG. 8B is an example rate dematching and polar decoding.

An example rate dematching and polar decoding is shown in FIG. 8B. One or more of the following may be performed.

The demodulated symbols (e.g., LLRs) from a transmission may be combined (e.g., soft combined) with the existing values in the circular buffer. For example, the LLR of a bit may be demodulated (e.g., demodulated to a value A1) in a first reception and/or decoding attempt. The LLR of the same bit may be demodulated (e.g., demodulated to A2) in a second reception and/or decoding attempt. The average of the LLRs (e.g., A1 and A2) may be used for the decoding of the bit. The combined LLRs may be saved in the circular buffer. The smallest index with a filled LLR value may be determined, for example, from the current status of the circular buffer. The formula denoted by (*) may be used to calculate the mother code length for polar decoding. The polar decoding may be applied, for example, using the selected mother code length. If one or more LLRs in the circular buffer is not filled for the current polar decoding, the default value of 0 may be used, for example, because in the puncturing rate matching scheme the punctured bit may be 0 or 1 (e.g., with equal probability).

Resource allocation for URLLC data may be performed. The re-ordered bits may be converted to modulation symbols. The modulation symbols may be mapped to frequency and/or time resources. For example, the resource mapping may be frequency first and time second. The resource mapping may be time first and frequency second.

The symbols may be partitioned from a (e.g., each) code block (CB) to several groups and/or the groups may be distributed over one or more (e.g., the entire) resources. The number of partitioned groups may be identical for initial transmissions and re-transmissions. The number of partitioned groups may depend on the data QoS and/or data size. For example, for large size data, the number of partitions may be large. For data with high reliability requirements, the number of partitions may be large.

The group size may be identical for one or more (e.g., all) CBs. The unified group size may facilitate the resource mapping of the groups.

The distribution of the groups may provide one or more of the following features. The groups (e.g., all the groups) may be within the same OFDM symbol, for example, to facilitate the prompt decoding. The groups (e.g., all the groups) may be mapped to frequency locations (e.g., different frequency locations) from the groups' previous transmissions, for example, to achieve the frequency diversity. No overlap, or less overlap, on the frequency domain may occur between the initial transmission and the retransmissions, for example, for the same CB.

A fixed group distribution pattern may be applied. The pattern may be a function of an RV index, a CB index, and/or a CBG index.

Figure 9A:
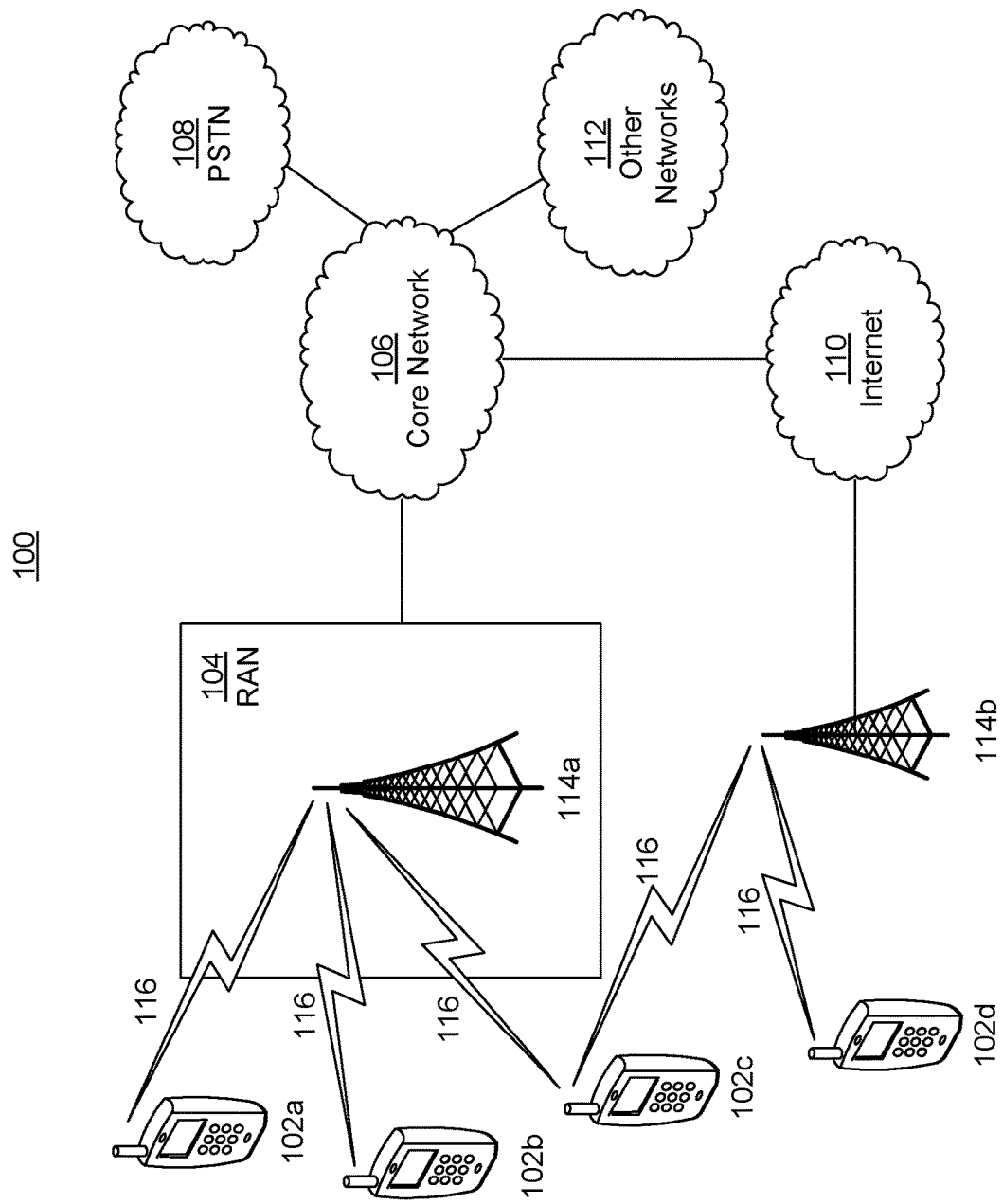
FIG. 9A is a system diagram illustrating an example communications system in which one or more disclosed embodiments may be implemented.

FIG. 9A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word DFT-Spread OFDM (ZT UW DTS-s OFDM), unique word OFDM (UW-OFDM), resource block-filtered OFDM, filter bank multicarrier (FBMC), and the like.

As shown in FIG. 9A, the communications system 100 may include wireless transmit/receive units (WTRUs) 102a, 102b, 102c, 102d, a RAN 104/113, a CN 106/115, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a "station" and/or a "STA", may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106/115, the Internet 110, and/or the other networks 112. By way of example, the base stations 114a, 114b may be a base transceiver station (BTS), a Node-B, an eNode B, a Home Node B, a Home eNode B, a gNB, a NR NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104/113, which may also include other base stations and/or network elements (not shown), such as a base station controller (BSC), a radio network controller (RNC), relay nodes, etc. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114a in the RAN 104/113 and the WTRUs 102a, 102b, 102c may implement a radio technology such as Universal Mobile Telecommunications System (UMTS) Terrestrial Radio Access (UTRA), which may establish the air interface 115/116/117 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed UL Packet Access (HSUPA).

In an embodiment, the base station 114a and the WTRUs 102a, 102b, 102c may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114a and the WTRUs 102a, 102b, 102c may implement a radio technology such as NR Radio Access, which may establish the air interface 116 using New Radio (NR).

In an embodiment, the base station 114a and the WTRUs 102a, 102b, 102c may implement multiple radio access technologies. For example, the base station 114a and the WTRUs 102a, 102b, 102c may implement LTE radio access and NR radio access together, for instance using dual connectivity (DC) principles. Thus, the air interface utilized by WTRUs 102a, 102b, 102c may be characterized by multiple types of radio access technologies and/or transmissions sent to/from multiple types of base stations (e.g., a eNB and a gNB).

In other embodiments, the base station 114a and the WTRUs 102a, 102b, 102c may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1×, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114b in FIG. 9A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114b and the WTRUs 102c, 102d may implement a radio technology such as IEEE 802.11 to establish a wireless local area network (WLAN). In an embodiment, the base station 114b and the WTRUs 102c, 102d may implement a radio technology such as IEEE 802.15 to establish a wireless personal area network (WPAN). In yet another embodiment, the base station 114b and the WTRUs 102c, 102d may utilize a cellular-based RAT (e.g., WCDMA, CDMA2000, GSM, LTE, LTE-A, LTE-A Pro, NR etc.) to establish a picocell or femtocell. As shown in FIG. 9A, the base station 114b may have a direct connection to the Internet 110. Thus, the base station 114b may not be required to access the Internet 110 via the CN 106/115.

The RAN 104/113 may be in communication with the CN 106/115, which may be any type of network configured to provide voice, data, applications, and/or voice over internet protocol (VoIP) services to one or more of the WTRUs 102a, 102b, 102c, 102d. The data may have varying quality of service (QoS) requirements, such as differing throughput requirements, latency requirements, error tolerance requirements, reliability requirements, data throughput requirements, mobility requirements, and the like. The CN 106/115 may provide call control, billing services, mobile location-based services, pre-paid calling, Internet connectivity, video distribution, etc., and/or perform high-level security functions, such as user authentication. Although not shown in FIG. 9A, it will be appreciated that the RAN 104/113 and/or the CN 106/115 may be in direct or indirect communication with other RANs that employ the same RAT as the RAN 104/113 or a different RAT. For example, in addition to being connected to the RAN 104/113, which may be utilizing a NR radio technology, the CN 106/115 may also be in communication with another RAN (not shown) employing a GSM, UMTS, CDMA 2000, WiMAX, E-UTRA, or WiFi radio technology.

The CN 106/115 may also serve as a gateway for the WTRUs 102a, 102b, 102c, 102d to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104/113 or a different RAT.

Some or all of the WTRUs 102a, 102b, 102c, 102d in the communications system 100 may include multi-mode capabilities (e.g., the WTRUs 102a, 102b, 102c, 102d may include multiple transceivers for communicating with different wireless networks over different wireless links). For example, the WTRU 102c shown in FIG. 9A may be configured to communicate with the base station 114a, which may employ a cellular-based radio technology, and with the base station 114b, which may employ an IEEE 802 radio technology.

Figure 9B:
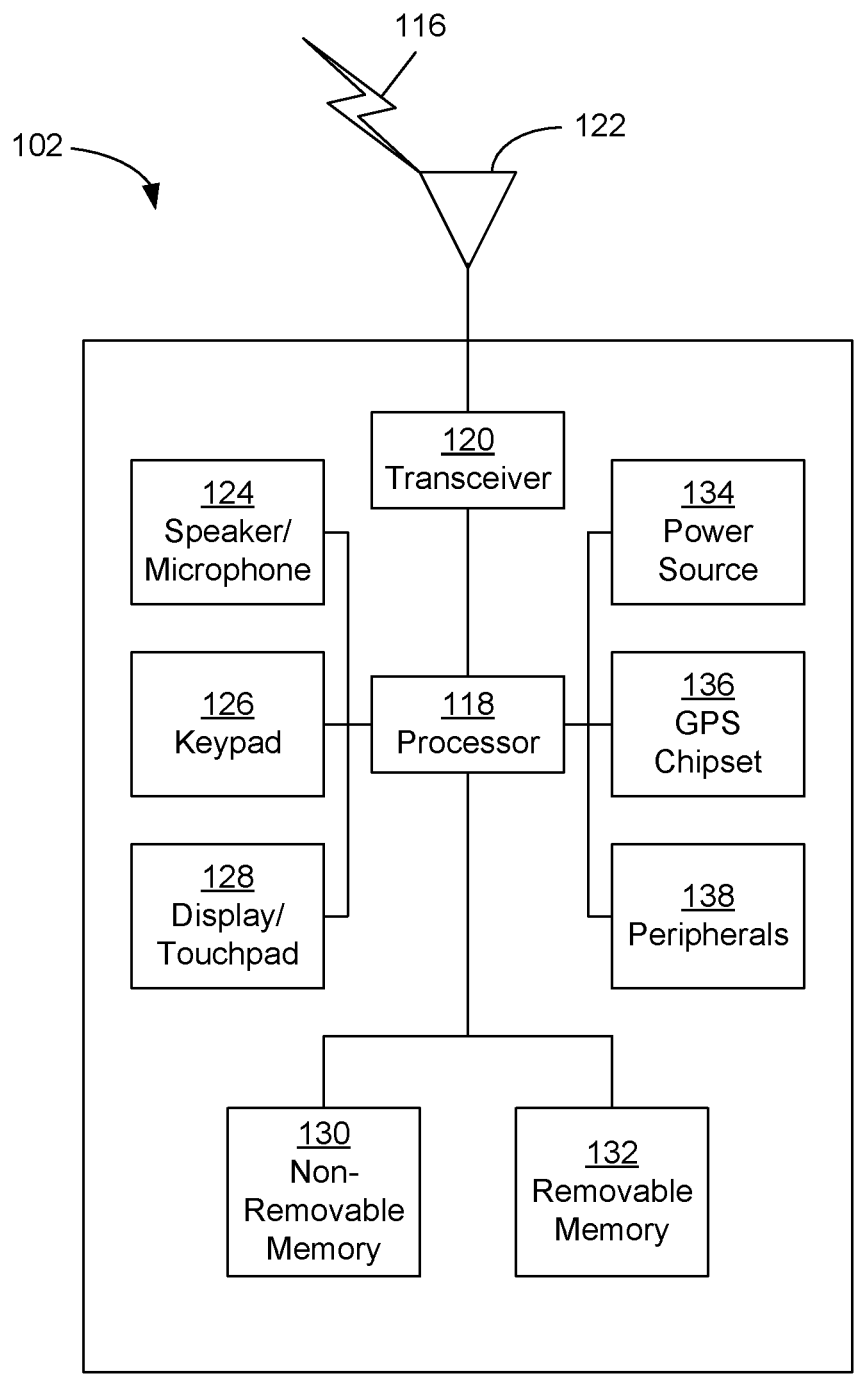
FIG. 9B is a system diagram illustrating an example wireless transmit/receive unit (WTRU) that may be used within the communications system illustrated in FIG. 9A according to an embodiment.

FIG. 9B is a system diagram illustrating an example WTRU 102. As shown in FIG. 9B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 9B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 9B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors, the sensors may be one or more of a gyroscope, an accelerometer, a hall effect sensor, a magnetometer, an orientation sensor, a proximity sensor, a temperature sensor, a time sensor; a geolocation sensor; an altimeter, a light sensor, a touch sensor, a magnetometer, a barometer, a gesture sensor, a biometric sensor, and/or a humidity sensor.

The WTRU 102 may include a full duplex radio for which transmission and reception of some or all of the signals (e.g., associated with particular subframes for both the UL (e.g., for transmission) and downlink (e.g., for reception) may be concurrent and/or simultaneous. The full duplex radio may include an interference management unit to reduce and or substantially eliminate self-interference via either hardware (e.g., a choke) or signal processing via a processor (e.g., a separate processor (not shown) or via processor 118). In an embodiment, the WRTU 102 may include a half-duplex radio for which transmission and reception of some or all of the signals (e.g., associated with particular subframes for either the UL (e.g., for transmission) or the downlink (e.g., for reception)).

Figure 9C:
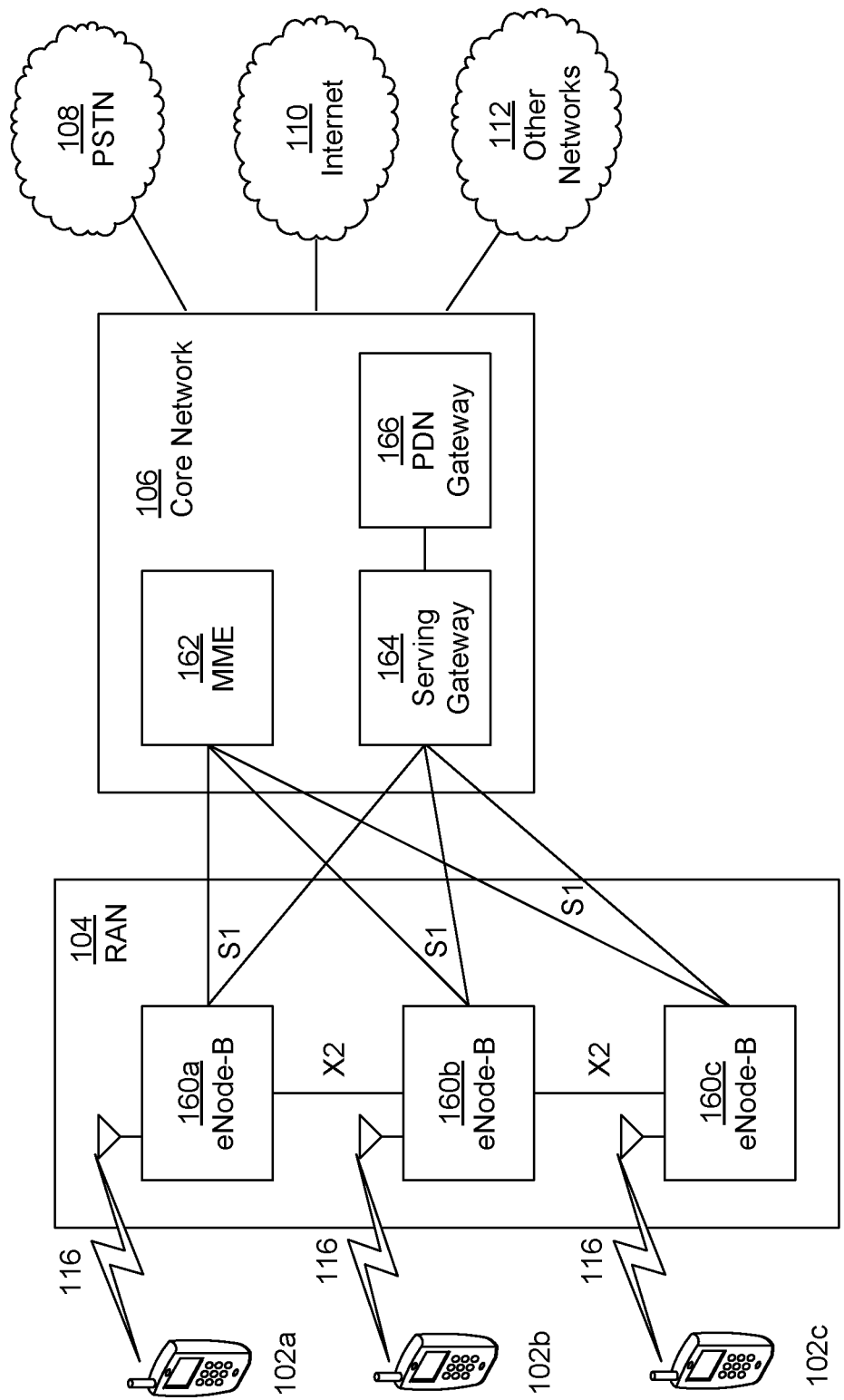
FIG. 9C is a system diagram illustrating an example radio access network (RAN) and an example core network (CN) that may be used within the communications system illustrated in FIG. 9A.

FIG. 9C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 9C, the eNode-Bs 160a, 160b, 160c may communicate with one another over an X2 interface.

The CN 106 shown in FIG. 9C may include a mobility management entity (MME) 162, a serving gateway (SGW) 164, and a packet data network (PDN) gateway (or PGW) 166. While each of the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 9A-9D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have an access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width via signaling. The primary channel may be the operating channel of the BSS and may be used by the STAs to establish a connection with the AP. In certain representative embodiments, Carrier Sense Multiple Access with Collision Avoidance (CSMA/CA) may be implemented, for example in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications, such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode), transmitting to the AP, the entire available frequency bands may be considered busy even though a majority of the frequency bands remains idle and may be available.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 9D:
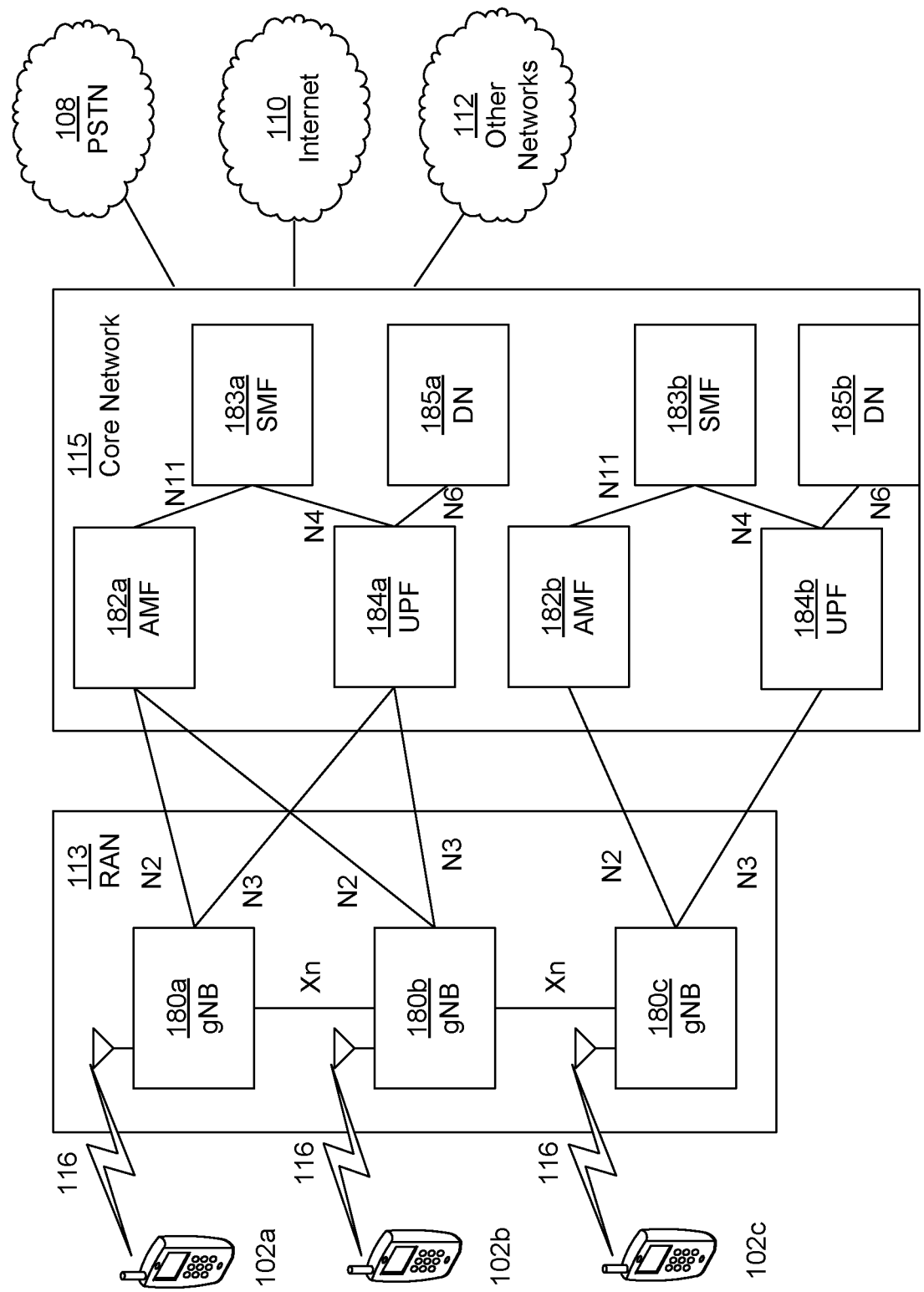
FIG. 9D is a system diagram illustrating a further example RAN and a further example CN that may be used within the communications system illustrated in FIG. 9A.

FIG. 9D is a system diagram illustrating the RAN 113 and the CN 115 according to an embodiment. As noted above, the RAN 113 may employ an NR radio technology to communicate with the WTRUs 102a, 102b, 102c over the air interface 116. The RAN 113 may also be in communication with the CN 115.

The RAN 113 may include gNBs 180a, 180b, 180c, though it will be appreciated that the RAN 113 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, dual connectivity, interworking between NR and E-UTRA, routing of user plane data towards User Plane Function (UPF) 184a, 184b, routing of control plane information towards Access and Mobility Management Function (AMF) 182a, 182b and the like. As shown in FIG. 9D, the gNBs 180a, 180b, 180c may communicate with one another over an Xn interface.

The CN 115 shown in FIG. 9D may include at least one AMF 182a, 182b, at least one UPF 184a,184b, at least one Session Management Function (SMF) 183a, 183b, and possibly a Data Network (DN) 185a, 185b. While each of the foregoing elements are depicted as part of the CN 115, it will be appreciated that any of these elements may be owned and/or operated by an entity other than the CN operator.

The AMF 182a, 182b may be connected to one or more of the gNBs 180a, 180b, 180c in the RAN 113 via an N2 interface and may serve as a control node. For example, the AMF 182a, 182b may be responsible for authenticating users of the WTRUs 102a, 102b, 102c, support for network slicing (e.g., handling of different PDU sessions with different requirements), selecting a particular SMF 183a, 183b, management of the registration area, termination of NAS signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for machine type communication (MTC) access, and/or the like. The AMF 162 may provide a control plane function for switching between the RAN 113 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 115 via an N11 interface. The SMF 183a, 183b may also be connected to a UPF 184a, 184b in the CN 115 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing downlink data notifications, and the like. A PDU session type may be IP-based, non-IP based, Ethernet-based, and the like.

The UPF 184a, 184b may be connected to one or more of the gNBs 180a, 180b, 180c in the RAN 113 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering downlink packets, providing mobility anchoring, and the like.

The CN 115 may facilitate communications with other networks. For example, the CN 115 may include, or may communicate with, an IP gateway (e.g., an IP multimedia subsystem (IMS) server) that serves as an interface between the CN 115 and the PSTN 108. In addition, the CN 115 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local Data Network (DN) 185a, 185b through the UPF 184a, 184b via the N3 interface to the UPF 184*a*, 184*b* and an N6 interface between the UPF 184*a*, 184*b* and the DN 185*a*, 185*b*.

In view of FIGS. 9A-9D, and the corresponding description of FIGS. 9A-9D, one or more, or all, of the functions described herein with regard to one or more of: WTRU 102*a-d*, Base Station 114*a-b*, eNode-B 160*a-c*, MME 162, SGW 164, PGW 166, gNB 180*a-c*, AMF 182*a-b*, UPF 184*a-b*, SMF 183*a-b*, DN 185*a-b*, and/or any other device(s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or may performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

Although the features and elements described herein consider LTE, LTE-A, New Radio (NR), and/or 5G specific protocols, it should be understood that the features and elements described herein are not restricted to LTE, LTE-A, New Radio (NR), and/or 5G specific protocols and may also be applicable to other wireless systems.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, UE, terminal, base station, RNC, or any host computer.

What is claimed:

1. A wireless transmit/receive unit (WTRU), comprising:
a processor configured at least in part to:
encode, using a polar coding operation, information bits input to a number of bit channels of a polar coder to obtain encoded bits, wherein the number of bit channels depends at least on a maximum number of transmissions and wherein the polar coding operation uses a mother code length that is based at least on the maximum number of transmissions;
store at least part of the encoded bits in a buffer; and
transmit encoded bits from the buffer.

2. The WTRU of claim 1, wherein the processor is further configured to partition the encoded bits into a number of parts, wherein the number of parts is a power of two, and wherein the number of parts depends at least on the maximum number of transmissions.

3. The WTRU of claim 2, wherein the processor is further configured to perform interleaving on at least some of the encoded bits in each part.

4. The WTRU of claim 2, wherein each respective part of the number of parts corresponds to a respective redundancy version, and wherein the processor is further configured to transmit each respective redundancy version, and wherein each respective redundancy version has a respective starting point in the buffer.

5. The WTRU of claim 2, wherein the processor is configured to transmit a first portion of the encoded bits stored in the buffer in a first transmission and a second portion of the encoded bits stored in the buffer in a second transmission.

6. The WTRU of claim 1, wherein the processor is configured to transmit up to the maximum number of transmissions using the encoded bits stored in the buffer during a single polar encoding operation.

7. The method of claim 6, further comprising performing interleaving on at least some of the encoded bits in each part.

8. The method of claim 6, wherein each respective part of the number of parts corresponds to a respective redundancy version, and wherein the method further comprises transmitting each respective redundancy version, and wherein each respective redundancy version has a respective starting point in the buffer.

9. A method comprising:
encoding, using a ploar coding operation, information bits input to a number of bit channels of a polar coder, wherein the number of bit channels depends at least on a maximum number of transmissions and wherein the polar coding operation uses a mother code length that is based at least on the maximum number of transmissions;
storing at least part of the encoded bits in a buffer; and
transmitting encoded bits from the buffer.

10. The method of claim 9, further comprising partitioning the encoded bits into a number of parts, wherein the number of parts is a power of two, and wherein the number of parts depends at least on the maximum number of transmissions.

11. The method of claim 10, further comprising transmitting a first portion of the encoded bits stored in the buffer in a first transmission and a second portion of the encoded bits stored in the buffer in a second transmission.

12. The method of claim 9, wherein transmitting of the encoded bits from the buffer includes transmitting up to the maximum number of transmissions using the encoded bits stored in the buffer during a single polar encoding operation.

* * * * *